United States Patent [19]

Hillstrom

[11] Patent Number: 4,983,924
[45] Date of Patent: Jan. 8, 1991

[54] METHOD AND APPARATUS FOR SYNCHRONIZED SWEEPING OF MULTIPLE INSTRUMENTS

[75] Inventor: Timothy L. Hillstrom, Everett, Wash.

[73] Assignee: Hewlett-Packard Company, Palo Alto, Calif.

[21] Appl. No.: 367,160

[22] Filed: Jun. 16, 1989

[51] Int. Cl.$^5$ .................... H03K 17/00; H03K 7/00
[52] U.S. Cl. ........................... 328/72; 328/63; 328/179; 307/269; 315/364
[58] Field of Search .................. 328/72, 63, 73, 75, 328/179; 307/480, 269; 315/364, 365, 367; 324/121 R; 331/172, 173, 174, 55, 56

[56] References Cited

U.S. PATENT DOCUMENTS 4,282,493  8/1981  Moreau .................................. 331/56
4,761,567  8/1988  Walters, Jr. et al. ................ 307/269

Primary Examiner—Timothy P. Callahan

[57] ABSTRACT

Time/frequency skew between a plurality of simultaneously operated swept instruments is minimized by sharing a common master clock signal among the instruments and resetting the phases of internal clocking signals in each instrument to known states. Once reset, the clocking signals in each of the instruments operate in tandem. Consequently, the triggering latency period among all the instruments is uniform and subsequent triggered sweeps begin at substantially the same instant, providing accurate sweep tracking among a plurality of instruments.

12 Claims, 1 Drawing Sheet

METHOD AND APPARATUS FOR SYNCHRONIZED SWEEPING OF MULTIPLE INSTRUMENTS

FIELD OF THE INVENTION

The present invention relates to electronic instrumentation, and more particularly relates to a method and apparatus for operating a plurality of swept instruments synchronously.

BACKGROUND AND SUMMARY OF THE INVENTION

In the test and measurement field, it is often desirable to operate a plurality of swept electronic instruments synchronously. Such is the case, for example, when measuring the performance of a mixer that is excited with input signals at one frequency and produces output signals at a different frequency. To characterize the mixer performance over a range of frequencies, the input is swept and the output is measured at an offset frequency swept in synchrony with the input. To illustrate, if the input signal sweeps across a frequency range of 1.0 to 1.1 MHz in a period of one second and is mixed with a 20 MHz local oscillator signal, the output monitoring instrument should sweep across the range 21.0 to 21.1 MHz, all within the same 1 second time period.

A more challenging example is measurement of harmonics produced by an amplifier circuit. In this case, the amplifier input may be swept from 1.0 to 1.1 MHz by a first instrument and a plurality of other instruments may monitor the amplifier's harmonic output by sweeping across different harmonic bands in synchrony with the input. Thus, one of the other instruments may sweep from 2.0 to 2.2 MHz, another of the instruments may sweep from 3.0 to 3.3 MHz, etc.

In the prior art, such measurements have been difficult to perform due to the difficulty in obtaining the requisite synchronized sweeps. It will be recognized that if the excitation signal is exciting the amplifier in the above-noted harmonic analysis example with a 1.05 Mhz signal, while a monitoring instrument is listening for the second harmonic at 2.0999 MHz (instead of 2.1000 MHz), the resulting analysis will be flawed. The degree of the error depends on the width of the passband within which the monitoring instrument is listening for the amplifier response. If the passband is 100 hertz, a 100 hertz skew between the harmonic of the excitation signal and the frequency of the monitoring instrument will prevent the signal from being properly detected.

Although the task of synchronizing the sweeping operation of several instruments may seem simple, it is not. The often-tried solution is to share among all the instruments a common reference frequency signal and common triggering signals. However, this solution fails because the instruments do not start their swept operations immediately in response to the triggering signal. Instead, there is a latency period, and the latency period may be different between identical instruments, even those sharing a common reference frequency signal. Consequently, instruments triggered at the same instant do not necessarily begin their swept operations simultaneously.

The variable latency period is attributable to the fact that the swept operation cannot be begun until certain clock signals internal to each instrument reach predetermined phase conditions. For example, in a representative instrument, internal clocking signals of 250, 187.5 and 100 KHz are used and the instrument cannot begin a sweep until all of the clocking signals share a common edge transition. This occurs once every 80 microseconds (i.e. once every 20 cycles of the 250 KHz signal, once every 15 cycles of the 187.5 KHz signal and once every 8 cycles of the 100 kilohertz signal). Even if these internal clocking signals are derived from the shared reference frequency signal (i.e. by frequency dividers), the phase relationships among the signals may be different in different instruments. This is because the phase, for example, of a 250 KHz signal derived from a 10 MHz reference signal in one instrument may have one of forty different phase relationships with a 250 kilohertz signal derived similarly in another instrument, depending on which cycle of the 10 MHz signal each instrument's divider circuitry began its operation. Other clocking signals in the instruments may be similarly skewed.

Accordingly, it is an object of the present invention to overcome this variable latency problem.

It is a more particular object of the present invention to sweep two or more instruments synchronously, with any desired mapping from one swept frequency range to the others.

It is another more particular object of the present invention to permit synchronized sweeps without requiring a handshaking operation between instruments.

In accordance with the present invention, the clocks in each of the instruments are reset and are started at the same instant by an externally applied signal The instruments' internal clock signal generators thus all begin simultaneously at a known phase and thereafter operate in tandem. When a trigger is thereafter received, there is still a latency period before a swept operation begins. However, since the clocks in all the instruments are operating synchronously, the latency period is the same for all the instruments.

The foregoing and additional features and advantages of the present invention will be more readily apparent from the following detailed description thereof, which proceeds with reference to the accompanying drawings.

DETAILED DESCRIPTION

For expository convenience, the present invention will be described with reference to an illustrative application in a swept frequency domain instrument, such as a network or a spectrum analyzer, although it will be recognized that the invention is not limited to such applications.

Swept frequency domain instruments typically have an internal time base circuit which generates all the timing and clocking signals necessary for the instrument's operation. Such circuits are conventional and usually operate by dividing down a master high frequency clocking signal into the desired instrument clocking signals. A 10 MHz master clocking signal is often used.

As noted earlier, such instruments can generally only begin a swept operation at certain times in the instrument's operation, these times typically being related to the phase of the instrument clocking signal(s). The instrument's time base circuitry generally includes a coincidence detector to indicate the occurrence of the proper phase conditions and to output a corresponding sweep enable signal on a Valid Sweep output line.

In many applications, it is desirable that a common reference frequency signal be provided to several instruments to insure that all time and frequency measurements made by the instruments are based on common references. In such cases, the reference frequency signal is provided to each instrument through a Reference Frequency input port. The instrument then applies this signal to a phased lock loop associated with its own internal master oscillator to insure that the internal instrument clocking signals are locked to the common reference signal.

Figure 1:
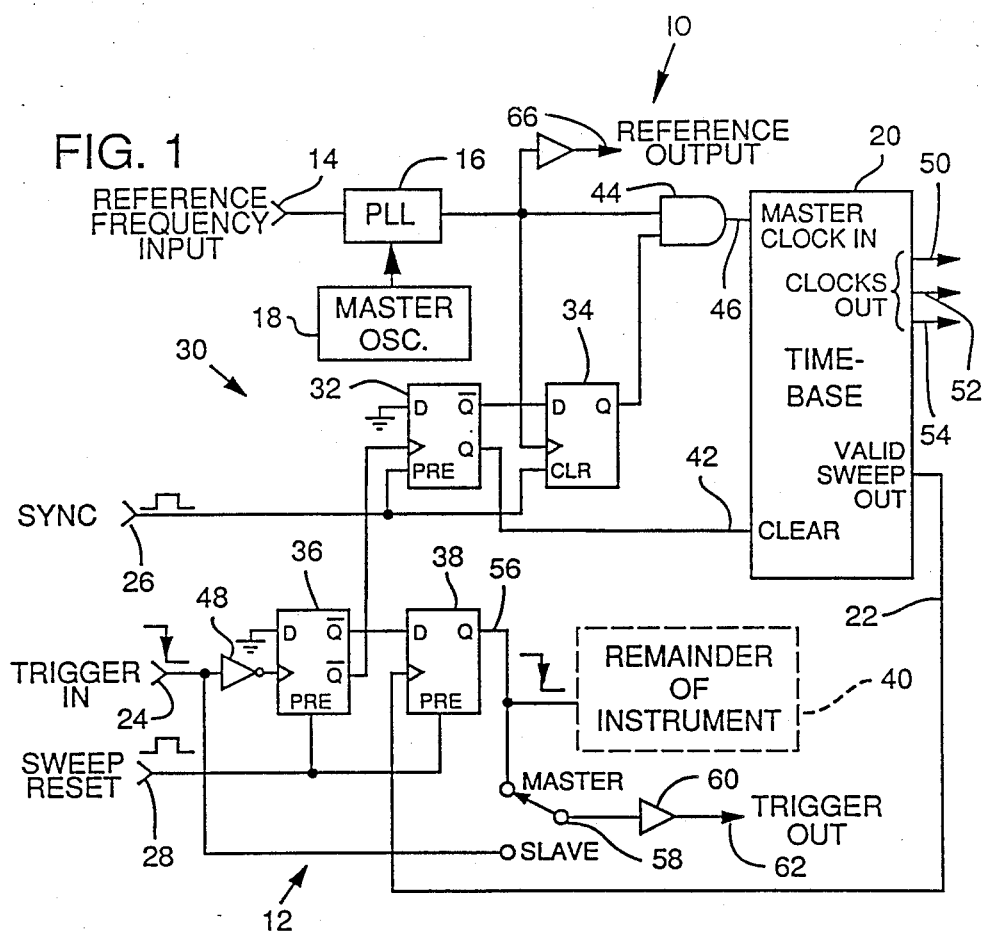
FIG. 1 is schematic block diagram of an instrument incorporating a trigger circuit according to one embodiment of the present invention.

Referring now to FIG. 1, there is shown a schematic block diagram of an instrument 10 that includes a trigger circuit 12 according to the present invention. Included in the instrument are the Reference Frequency input port 14, the phase locked loop 16, the master oscillator 18, the time base circuitry 20 and the Valid Sweep output 22 mentioned above. Additionally included are a Trigger input 24, a Sync input 26 and a Sweep Reset input 28. Signals provided to these inputs operate on a logic circuit 30 comprised of four D flip-flops 32-38 and cause this logic circuit to reset the instrument clocking signals produced by time base circuitry 20 to a known initial phase state. These input signals additionally cause the logic circuit 30 to provide a trigger output signal to other circuits 40 in the instrument to initiate their swept frequency operation when a sweep enable signal on the Valid Sweep output line 22 next indicates that a sweep may begin.

When it is desired to operate instruments synchronously, the Sync input 26 of each instrument is pulsed high to reset its logic circuit 30. This positive pulse presets the first flip-flop 32 and clears the second flip-flop 34. Presetting the first flip-flop 32 provides a logic zero to the D input of the second flip-flop and provides a logic one to a clear input 42 of the timebase circuit 20. The logic one at the clear input 42 of the timebase circuit resets all of the instrument clocks to the logic zero state. Clearing the second flip-flop 34 brings its Q output to zero, which gates an AND gate 44 off, preventing the master oscillator signal from passing to a master clock input 46 of the time base circuitry 20. (In the illustrated embodiment, a circuit converts the 10 MHz master clock signal to a 1.5 MHz signal prior to AND gate 44. This circuitry is omitted for clarity of illustration and is not needed to practice the invention.) The sync pulse thus clears and disables an instrument's timebase circuit.

Synchronization is completed by issuing a first trigger command. Each trigger command, however, must first be preceded by a positive pulse applied to the Sweep Reset input 28. This positive pulse presets the third and fourth flip-flops 36, 38, forcing their Q outputs to a logic one state. Presetting of the third flip-flop 36 additionally provides a logic zero at the clock input of the first flip-flop, preparing it to be clocked by a rising edge produced by the following signal.

The trigger signal itself consists of a falling edge that is inverted by an inverter 48 and applied to the clock input of the third flip-flop 36. Clocking of the third flip-flop 36 causes its Q output to go to logic one, which clocks the first flip-flop 32 and brings the clear input 42 of the timebase circuit 20 back to its logic zero state, ending its clearing action. Clocking of the first flip-flop 32 also readies a logic one at the D input of the second flip-flop 34, which is clocked to its Q output at the next rising edge of the master oscillator 18 and serves to turn AND gate 44 back on, reapplying clock signals to the master clock input 46 of the timebase circuit 20. This first trigger signal thus restarts the timebase circuit 20, which thereafter operates without interruption for the remainder of the instrument's operation (unless a new sync signal is applied to input 26), producing on output lines '44-'48 the instrument clocking signals.

When the newly restarted instrument clocking signals have a common transition (or such other predetermined phase relationship as the instrument may require), the timebase circuitry 20 outputs a sweep enable signal on the Valid Sweep line 22. This signal is applied to the clock input of the fourth flip-flop 38 and immediately clocks a logic zero that was readied at its D input by the trigger signal to its Q output, bringing that output to logic zero. This falling edge signal is the internal triggering signal that is applied on a line 56 to the remainder of the instrument circuitry 40 and causes it immediately to begin a sweep operation.

A switch 58 selects whether an instrument is to be used as a master or as a slave. If used as a master, the output signal on line 56 is buffered by an amplifier 60 and provided to a trigger output port 62 for connection to a slave instrument. If the switch is set to configure the instrument as a slave, a trigger signal applied to its trigger input 24 is immediately buffered by amplifier 60 and output through the trigger output port 62 for connection to another slave instrument.

Figure 2:
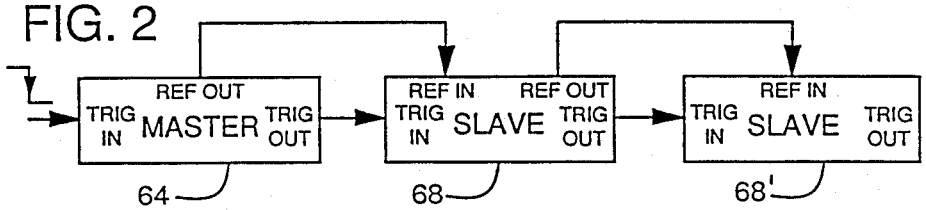
FIG. 2 shows the interconnection of a plurality of the FIG. 1 instruments according to one embodiment of the present invention.

FIG. 2. shows the interconnection of a plurality of instruments 10 employing the above-described trigger circuit 12 to perform synchronous sweeps according to one embodiment of the invention. In this arrangement, the master oscillator signal from the master instrument 64 is applied from the master's reference output port 66 to the Reference Frequency inputs 14 of the other slave instruments 68. This connection is typically made in daisy chain fashion, as illustrated, to avoid undue loading of the master oscillator. The output signal from the master instrument's Trigger output port 62 is similarly daisy chained through each of the slave instruments.

In operation, all instruments are initially prepared for synchronous operation by pulsing their Sync inputs 26. As noted, this interrupts and resets each instrument's timebase circuit. The instruments are then prepared for the first sweep by pulsing their Sweep Reset inputs 28. The first trigger signal restarts the timebase circuitry of all of the instruments at a given edge in the reference frequency input signal. Thereafter, the instruments' internal clocking signals all operate synchronously, providing outputs on their Valid Sweep output lines 22 at the same instants. Whenever further synchronous sweeps are required, the Sweep Reset inputs 28 are again pulsed (not necessarily synchronously) and another trigger signal is coupled to all the instruments, triggering a swept operation at their next valid phase condition. Since the instrument clocking signals in the master and slaves were all synchronously restarted by the first trigger signal, the next valid phase condition for the master occurs at the same instant as for all the slaves. All instruments thus begin their sweeps at substantially the same instant and track each other in the relationship (harmonic, offset, or any other desired mapping) desired.

Figure 3:
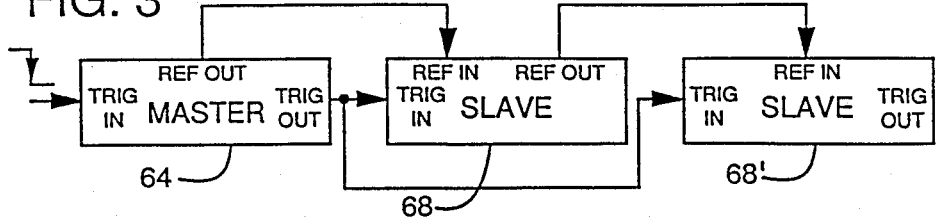
FIG. 3 shows the interconnection of a plurality of the FIG. 1 instruments according to another embodiment of the present invention.

FIG. 3 shows an alternative interconnection arrangement wherein the triggering signals are provided to the slaves in parallel, rather than in the daisy chain fashion shown in FIG. 2.

It will be recognized that, since the trigger signal provided to the slaves is generated by the master, there is a small delay between the receipt of a trigger signal by the master and the receipt of trigger signals by the slaves. However, this delay is quite small. The slave trigger latency can be expressed as:

$$T_1 + T_2 + T_3$$

where $T_1$ is the local oscillator sweep latency, $T_2$ is the reciprocal of the master oscillator frequency, and $T_3$ is the logic propagation delay. In an illustrative embodiment, $T_1$ may be 10 microseconds, $T_2$ may be 1.6 microseconds and $T_3$ may be 1 microsecond, for a total sweep latency of 12.6 microseconds. It will be recognized that if the instrument bandwidth is 100 hertz and it is sweeping from 3.0 to 3.3 MHz in a period of 1 second (as postulated in an example in the Background discussion), the instrument is sweeping at a rate of 300 KHz per second. A sweep latency error of 12.6 microseconds thus corresponds to a frequency skew of 3.78 hertz, well within the instrument's 100 hertz passband. If the instrument displays the results of the 300 KHz sweep as a series of 400 data points on a screen display, each data point will represent approximately 750 hertz, so again the 3.78 hertz trigger latency error is of no consequence.

Thus, the foregoing arrangement permits a plurality of instruments to be operated synchronously, with the trigger latency sufficiently small that there is no significant frequency skew between any instruments.

Having described and illustrated the principles of my invention with reference to a preferred embodiment, it will be apparent that the invention can be modified in arrangement and detail without departing from such principles. For example, while the illustrated embodiment requires a sweep reset pulse prior to each trigger signal, it will be recognized that alternative circuitry can readily be adopted to obviate this requirement. Similarly, while the illustrated embodiment does not require any hand shaking between instruments, it will be recognized that in alternative embodiments such hand shaking can be provided with advantageous results. Finally, while the timebase in the illustrated embodiment is restarted in response to the first trigger signal following the sync pulse, it will be recognized that the timebase can be restarted in response to any external signal applied substantially synchronously to all of the instruments. A great variety of other modifications can likewise be devised.

In view of these and the wide variety of other embodiments to which the principles of my invention may be applied, it should be recognized that the disclosed embodiment is illustrative only and is not intended to limit the scope of my invention. Instead, I claim as my invention all such modifications as may fall within the scope and spirit of the following claims and equivalents thereto.

I claim:

1. A trigger circuit for a swept instrument that permits swept operations to start only at certain phase conditions of an internal instrument clocking signal, the trigger circuit comprising:
   trigger input means for receiving an input trigger signal;
   reference clock input means for receiving a reference clock frequency signal;
   timebase means coupled to the reference clock input means for dividing said reference clock to produce the instrument clocking signal, said instrument clocking signal having a frequency lower than the reference frequency;
   reset means responsive to an externally applied timebase reset signal for causing the timebase means to start producing the instrument clocking signal beginning at a known phase state; and
   means responsive to the input trigger signal for providing an internal triggering signal to other circuitry in the instrument to initiate its swept operation at the next of said certain phase conditions.

2. The circuit of claim 1 in which the timebase reset signal is a trigger input signal.

3. A method of synchronizing the sweeping of first and second swept instruments, each of said instruments permitting swept operations to start only at certain phase conditions of an internal instrument clocking signal, the method comprising the steps:
   providing trigger circuits in each of the first and second instruments, the trigger circuits comprising: a trigger input means for receiving an input trigger signal, a reference clock input means for receiving a reference clock frequency signal, a timebase means coupled to the reference clock input means for dividing said reference clock to produce the instrument clocking signal, said instrument clocking signal having a frequency lower than the reference frequency, a means responsive to an externally applied timebase reset signal for causing the timebase means to start producing the instrument clocking signal beginning at a known phase state, and a means responsive to the input trigger signal for providing an internal triggering signal to other circuitry in the instrument to initiate its swept frequency operation at the next of said certain phase conditions;
   coupling a common source of reference clock signals to the reference clock input means of the first and second instruments;
   providing timebase reset signals synchronously to the first and second instruments; and
   providing input trigger signals synchronously to the first and second instruments.

4. The method of claim 3 which additionally comprises the step: providing a trigger output signal from the first instrument to the trigger input means of the second instrument.

5. A method of synchronizing the sweeping of first and second and third swept instruments according to the method of claim 4 which additionally comprises:
   providing said trigger circuit in the third instrument;
   coupling the source of reference clock signals to the reference clock input means of the third instrument;
   providing a timebase reset signal to the third instrument synchronously with that provided to the first and second instruments; and providing a trigger input signal to the third instrument synchronously with that provided to the first and second instruments.

6. A method of synchronizing the sweeping of a plurality of swept instruments, each of said instruments permitting swept operations to start only at certain phase conditions of an internal instrument clocking signal, the method comprising the steps:
   providing a common reference frequency signal to the instruments;
   deriving in each of said instruments from said reference frequency signal at least one internal instrument clocking signal having a frequency lower than the common reference frequency signal;
   resetting the phase of each of the instrument clocking signals to a known value in response to a signal applied synchronously to all of said instruments;
   providing trigger input signals to each of said instruments; and
   beginning the swept operation of each of said instruments at one of said certain phase conditions after the phase of the instrument clocking signals has been reset and in response to said trigger signals.

7. The method of claim 6 which further includes the step of providing a trigger output signal from one of said instruments and providing said trigger output signal as the trigger input signal to another of said instruments.

8. In a method of operating a plurality of swept instruments wherein common reference frequency and triggering signals are applied to each of the instruments, an improvement comprising resetting an internal clock generator in each instrument and restarting operation of said clock generators at the same instant in response to an externally applied signal.

9. The method of claim 8 in which the externally applied signal is a sweep triggering signal.

10. In a method of operating a plurality of swept instruments wherein common reference frequency and triggering signals are applied to each of the instruments and in which each instrument includes an oscillator that provides signals to a timebase circuit, an improvement comprising:
   interrupting the signals provided from the oscillator to the timebase circuit in each of said instruments;
   resetting the timebase circuit in each of said instruments; and
   restoring signals from the oscillator to the timebase circuit in each of said instruments at substantially the same instant.

11. A trigger circuit for a swept instrument that permits swept operations to start only at certain phase conditions of an internal instrument clocking signal, the trigger circuit comprising:
   a clock circuit for generating the internal instrument clocking signal;
   first logic means for resetting said clock circuit;
   second logic means for restarting said clock circuit in response to an externally applied signal; and
   third logic means for initiating an instrument sweep at one of said certain phase conditions following the restarting of said clock circuit by the second circuit and in response to a trigger input signal.

12. The trigger circuit of claim 11 in which the externally applied signal is a trigger input signal.

* * * * *